United States Patent
Park et al.

(10) Patent No.: US 10,566,530 B2
(45) Date of Patent: Feb. 18, 2020

(54) METHOD OF FABRICATING SEMICONDUCTOR DEVICES

(71) Applicant: Samsung Electronics Co., Ltd., Suwon-si (KR)

(72) Inventors: Changyup Park, Hwaseong-si (KR); Jeonghee Park, Hwaseong-si (KR); Jaeho Jung, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/170,108

(22) Filed: Oct. 25, 2018

(65) Prior Publication Data

US 2019/0288204 A1    Sep. 19, 2019

(30) Foreign Application Priority Data

Mar. 15, 2018   (KR) .................. 10-2018-0030390
Mar. 30, 2018   (KR) .................. 10-2018-0037425

(51) Int. Cl.
*H01L 45/00*   (2006.01)
*H01L 27/24*   (2006.01)

(52) U.S. Cl.
CPC ...... *H01L 45/1658* (2013.01); *H01L 27/2409* (2013.01); *H01L 45/1683* (2013.01); *H01L 45/06* (2013.01); *H01L 45/1233* (2013.01); *H01L 45/144* (2013.01); *H01L 45/1625* (2013.01)

(58) Field of Classification Search
CPC ............. H01L 27/2409; H01L 45/1233; H01L 45/144; H01L 45/1625; H01L 45/1683; H01L 45/1253; H01L 45/065; H01L 45/1658; H01L 45/06
See application file for complete search history.

(56) References Cited

U.S. PATENT DOCUMENTS

| | | | |
|---|---|---|---|
| 7,838,326 B2 | 11/2010 | Lee et al. |
| 8,557,627 B2 | 10/2013 | Oh et al. |
| 8,580,606 B2 | 11/2013 | Park et al. |
| 8,618,524 B2 | 12/2013 | Liang et al. |
| 8,865,558 B2 | 10/2014 | Park et al. |
| 2006/0249724 A1 | 11/2006 | Krusin-Elbaum et al. |
| 2010/0159636 A1 | 6/2010 | Kim et al. |
| 2010/0283029 A1 | 11/2010 | Dennison et al. |

FOREIGN PATENT DOCUMENTS

JP    2013-055258 A    3/2013

OTHER PUBLICATIONS

Machine Translation of Kikuchi et al , JP 2013055258 A (Mar. 21, 2013).*

* cited by examiner

*Primary Examiner* — Caridad Everhart
(74) *Attorney, Agent, or Firm* — Muir Patent Law, PLLC

(57) ABSTRACT

Disclosed is a method of fabricating a semiconductor device. The method may include forming a mold layer on a substrate, the mold layer having a hole exposing a portion of the substrate, forming a phase transition layer with a void, in the hole, and thermally treating the phase transition layer to remove the void from the phase transition layer. The thermal treating of the phase transition layer may include heating the substrate to a first temperature to form a diffusion layer in the phase transition layer, and the first temperature may be lower than or equal to 55% of a melting point of the phase transition layer.

20 Claims, 16 Drawing Sheets

METHOD OF FABRICATING SEMICONDUCTOR DEVICES

CROSS-REFERENCE TO RELATED APPLICATIONS

This U.S. non-provisional patent application claims the benefit of priority under 35 U.S.C. § 119 to Korean Patent Application No. 10-2018-0030390, filed on Mar. 15, 2018, and Korean Patent Application No. 10-2018-0037425, filed Mar. 30, 2018, in the Korean Intellectual Property Office, the entire contents of both of which are hereby incorporated by reference.

BACKGROUND OF THE INVENTION

The present disclosure relates to a method of fabricating a semiconductor device, and in particular, to a method of fabricating a semiconductor device including a phase transition memory device.

In general, a change in phase of chalcogenide compound results in a change in electrical resistance of the chalcogenide compound, and thus, the chalcogenide compound may be used as a phase transition layer of a phase transition memory device. The phase-resistance property of the chalcogenide compound may be used as a data storing mechanism for the phase transition memory device. For example, the phase transition layer has different resistance values, when it is in amorphous and crystalline states.

SUMMARY

Some embodiments provide a method of removing void from a phase transition layer when a semiconductor device with the phase transition layer is fabricated.

According to some embodiments, the disclosure is directed to a method of fabricating a semiconductor device, comprising: forming a mold layer on a substrate, the mold layer having a hole exposing a portion of the substrate; forming a phase transition layer in the hole, the phase transition layer having at least one of a void and an overhang; and thermally treating the phase transition layer to remove the at least one of the void and the overhang from the phase transition layer, wherein thermally treating the phase transition layer comprises heating the substrate to a first temperature to form a diffusion layer in the phase transition layer, and wherein the first temperature is lower than or equal to 55% of a melting point of the phase transition layer.

According to some embodiments, the disclosure is directed to a method of fabricating a semiconductor device, comprising: forming a mold layer on a substrate, the mold layer having a hole exposing a portion of the substrate; forming a phase transition layer in the hole at a first temperature higher than room temperature, the phase transition layer having a void; and thermally treating the phase transition layer at a second temperature to remove the void, the second temperature being higher than the first temperature, wherein the second temperature is lower than or equal to 55% of a melting point of the phase transition layer.

According to some embodiments, the disclosure is directed to a method of fabricating a semiconductor device, comprising: forming a mold layer on a substrate, the mold layer having a hole exposing a portion of the substrate; forming a phase transition layer in the hole at a first temperature, the phase transition layer having a void; and thermally treating the phase transition layer at a second temperature to remove the void from the phase transition layer, wherein forming the phase transition layer in the hole comprises heating the substrate to the first temperature, wherein thermally treating the phase transition layer comprises heating the substrate to the second temperature to form a diffusion layer in the phase transition layer, and wherein the first temperature is in a range of 40%-50% of a melting point of the phase transition layer and the second temperature is lower than or equal to 55% of a melting point of the phase transition layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown.

Figure 1:
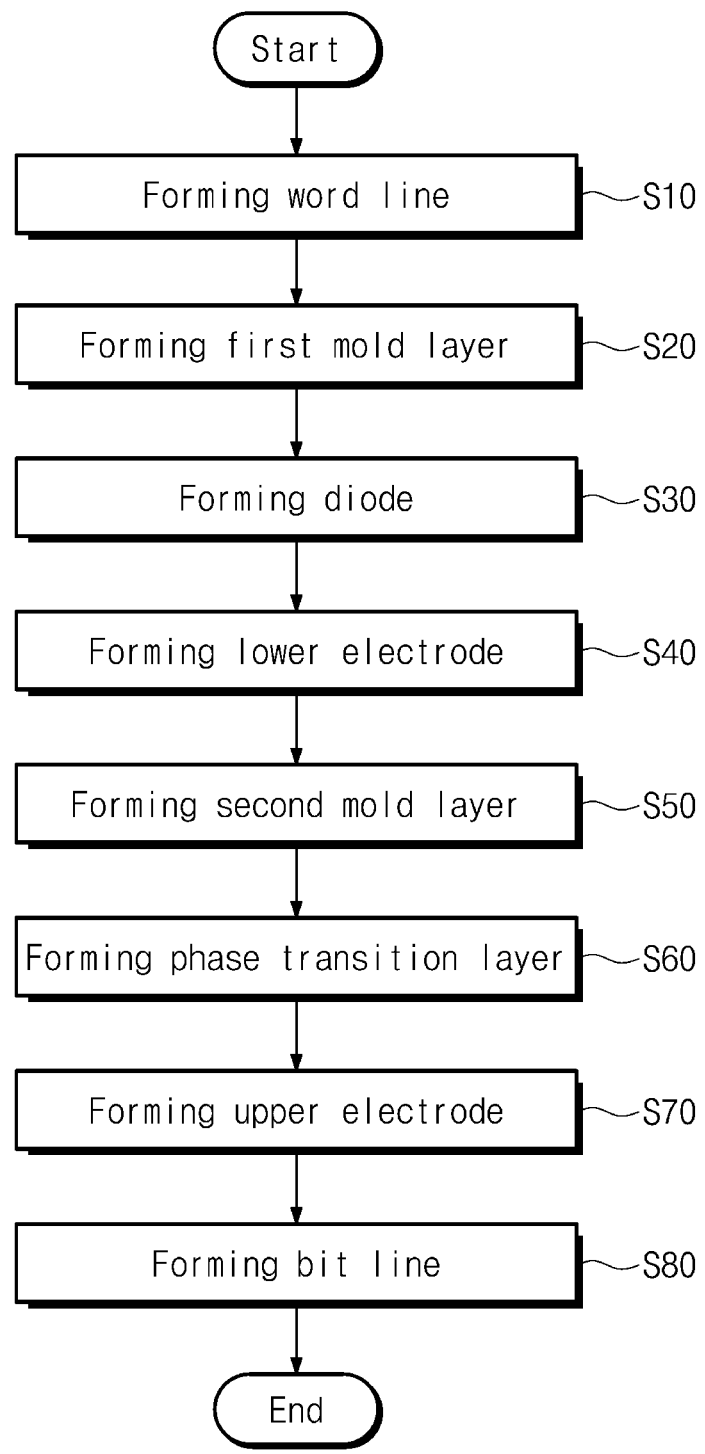
FIG. 1 is a flow chart illustrating a method of fabricating a semiconductor device, according to some example embodiments.

FIG. 1 illustrates a method of fabricating a semiconductor device, according to some example embodiments.

Referring to FIG. 1, a method of fabricating a semiconductor device, according to some example embodiments, may be used to fabricate a phase transition memory device. In some embodiments, the method may include forming a word line (in S10), forming a first mold layer (in S20), forming a diode (in S30), forming a lower electrode (in S40), forming a second mold layer (in S50), forming a phase transition layer (in S60), forming an upper electrode (in S70), and forming a bit line (in S80).

FIGS. 2 to 11 are sectional views illustrating certain steps of the fabrication method of FIG. 1.

Figure 2:
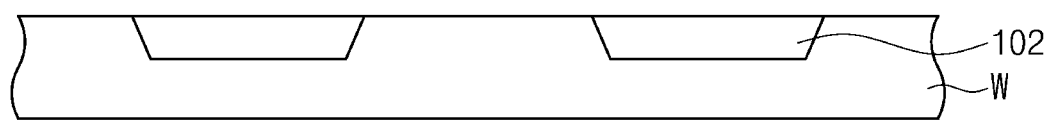
FIGS. 2 to 11 are sectional views illustrating some steps of the fabrication method of FIG. 1.

Referring to FIGS. 1 and 2, a word line 102 may be formed on the substrate W (in S10). The substrate W may be or may include a silicon wafer. The word line 102 may be formed of or may include at least one of conductive materials (e.g., doped silicon or metals). In some embodiments, the word line 102 may be formed by an ion implantation process of injecting dopants into the substrate W. In certain embodiments, the word line 102 may include a metal layer, which may be formed by, for example, a photolithography process, an etching process, a deposition process, and a polishing process. The word line 102 may be formed on the substrate W to extend in a first direction (not shown).

Figure 3:
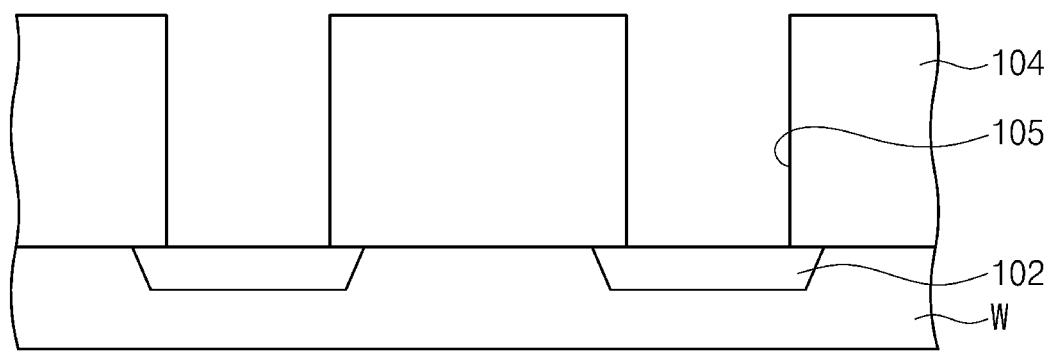

Referring to FIGS. 1 and 3, a first mold layer 104 may be formed on the substrate W to cover at least a portion of the word line 102 (in S20). The first mold layer 104 may be formed of or include at least one of dielectric materials (e.g., silicon oxide, silicon nitride, or silicon oxynitride). The first mold layer 104 may be formed by depositing a dielectric layer using a deposition process (e.g., CVD). The first mold layer 104 may be formed to have a first contact hole 105. The first contact hole 105 may be formed to expose a portion of the word line 102. The formation of the first contact hole 105 may include performing a photolithography process and then performing an etching process on the first mold layer 104.

Figure 4:
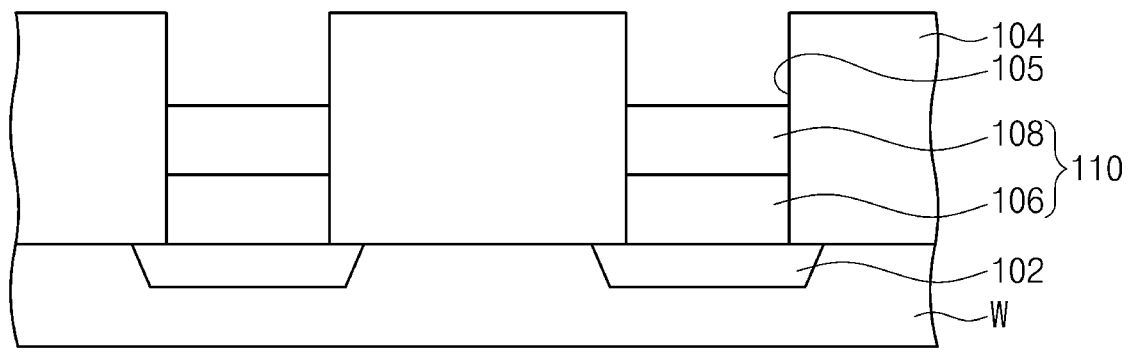

Referring to FIGS. 1 and 4, a diode 110 may be formed in the first contact hole 105 of the first mold layer 104 (in S30). The diode 110 may be formed within a lower region of the first contact hole 105. The formation of the diode 110 may include forming a poly silicon layer using a deposition process and performing an ion implantation process of injecting dopants (e.g., boron or arsenic) into the poly silicon layer. The diode 110 may be replaced with an Ovonic threshold switching (OTS) device containing amorphous chalcogenide compound (e.g., of GeSe). The diode 110 may be formed to include a first doped region 106 and a second doped region 108. The first doped region 106 may be formed in the first contact hole 105 and on the word line 102. The first doped region 106 may be in contact with a top surface of the word line 102. The second doped region 108 may be formed on the first doped region 106. The second doped region 108 may be in contact with a top surface of the first doped region 106. The term "contact," as used herein, refers to a direct or physical contact (i.e., touching) unless the context indicates otherwise. Dopants in the first doped region 106 may be different from those in the second doped region 108. For example, in the case where the dopants in the first doped region 106 are boron, the dopants in the second doped region 108 may be arsenic.

Figure 5:
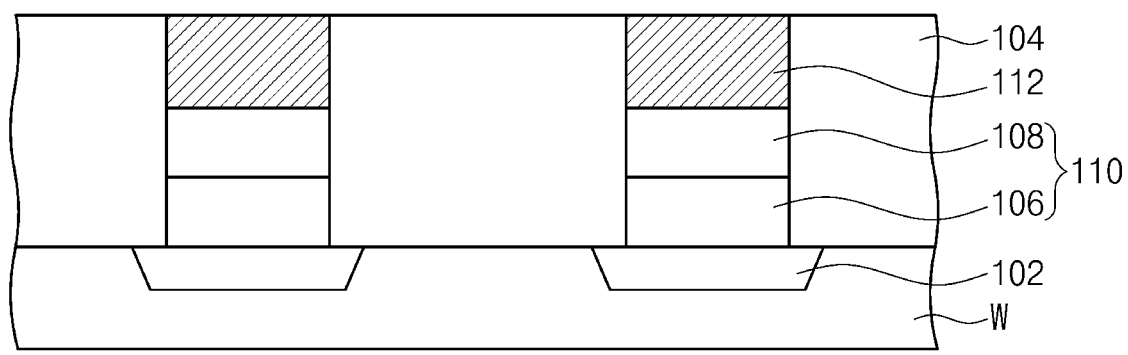

Referring to FIGS. 1 and 5, a lower electrode 112 may be formed on the diode 110 (in S40). The lower electrode 112 may be formed in an upper region of the first contact hole 105. The lower electrode 112 may be in contact with a top surface of the second doped region 108. A top surface of the lower electrode 112 may be at the same vertical level as a top surface of the first mold layer 104. In some embodiments, the lower electrode 112 may be formed by a damascene process. For example, the formation of the lower electrode 112 may include forming a metal and/or metal silicide layer using a deposition process and polishing the metal and/or metal silicide layer.

Figure 6:
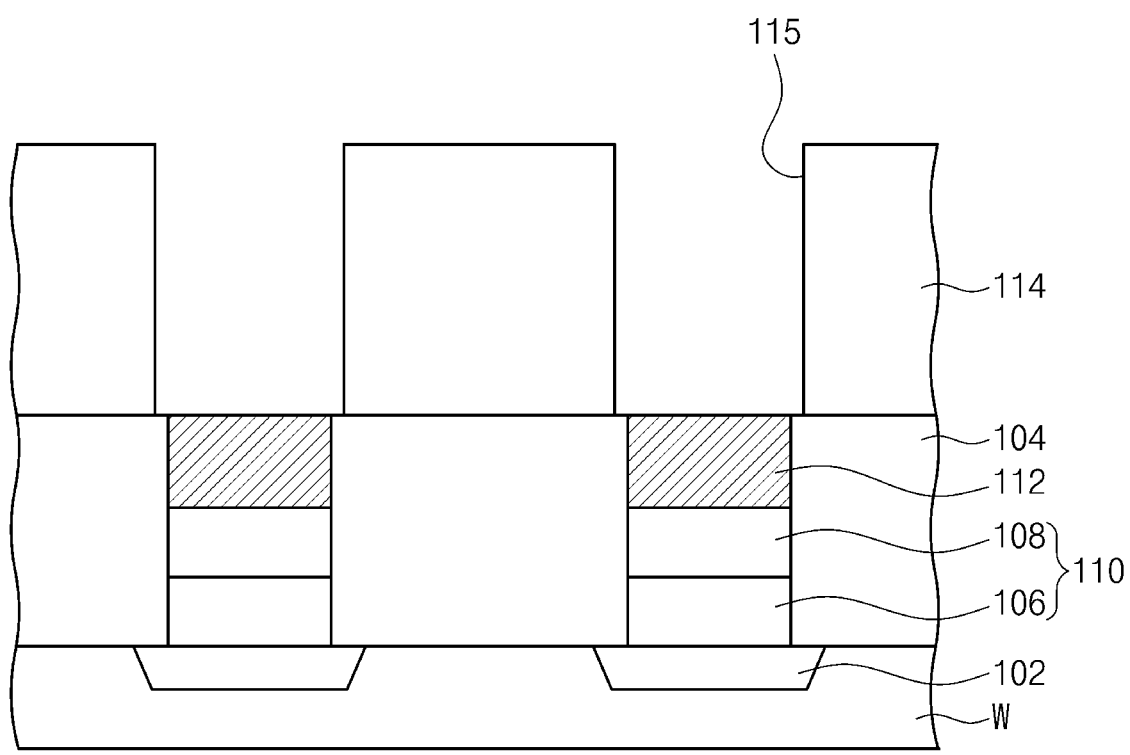
Figure 7:
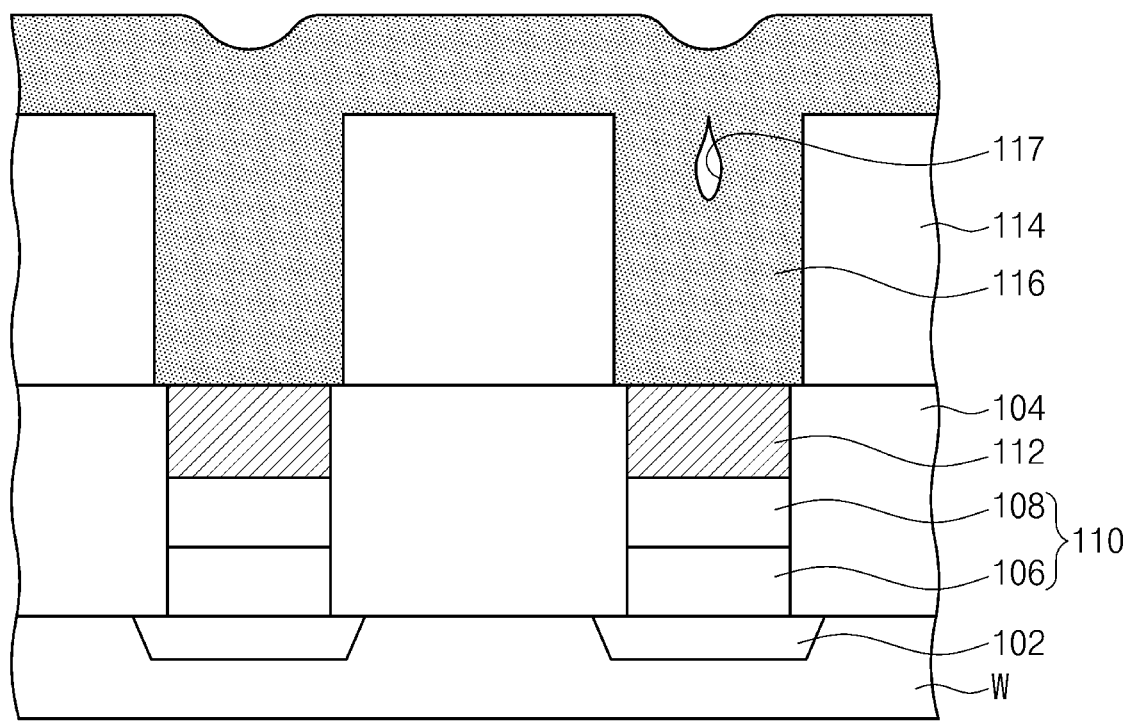

Referring to FIGS. 1 and 6, a second mold layer 114 may be formed on the lower electrode 112 and the first mold layer 104 (in S50). The second mold layer 114 may be formed of or include at least one of dielectric materials (e.g., silicon oxide, silicon nitride, or silicon oxynitride). The second mold layer 114 may be formed by depositing a dielectric layer using a deposition process (e.g., CVD). The second mold layer 114 may be formed to have a second contact hole 115 exposing the lower electrode 112. In some embodiments, the second mold layer 114 may expose an entire top surface of the lower electrode 112 and at least a portion of the top surface of the first mold layer 104. The formation of the second contact hole 115 may include performing a photolithography process and then performing an etching process on the second mold layer 114. For example, the second contact hole 115 may be formed to have a width of about 20 nm or smaller and a depth of about 60 nm or larger. The second contact hole 115 may have an aspect ratio (e.g., of depth to width) of about 3.0:1 or higher. The aspect ratio of the second contact hole 115 may be increased depending on a voltage property of the phase transition memory device (e.g., in proportion to a threshold voltage ($V_{th}$) of the phase transition memory device). Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Referring to FIG. 1 and FIGS. 7 to 9, a phase transition layer 116 may be formed on the lower electrode 112 and in the second contact hole 115 (in S60). In some embodiments, the phase transition layer 116 may fill the second contact hole 115 and cover a top surface of the second mold layer 114. The phase transition layer 116 may be formed by a damascene process.

Figure 12:
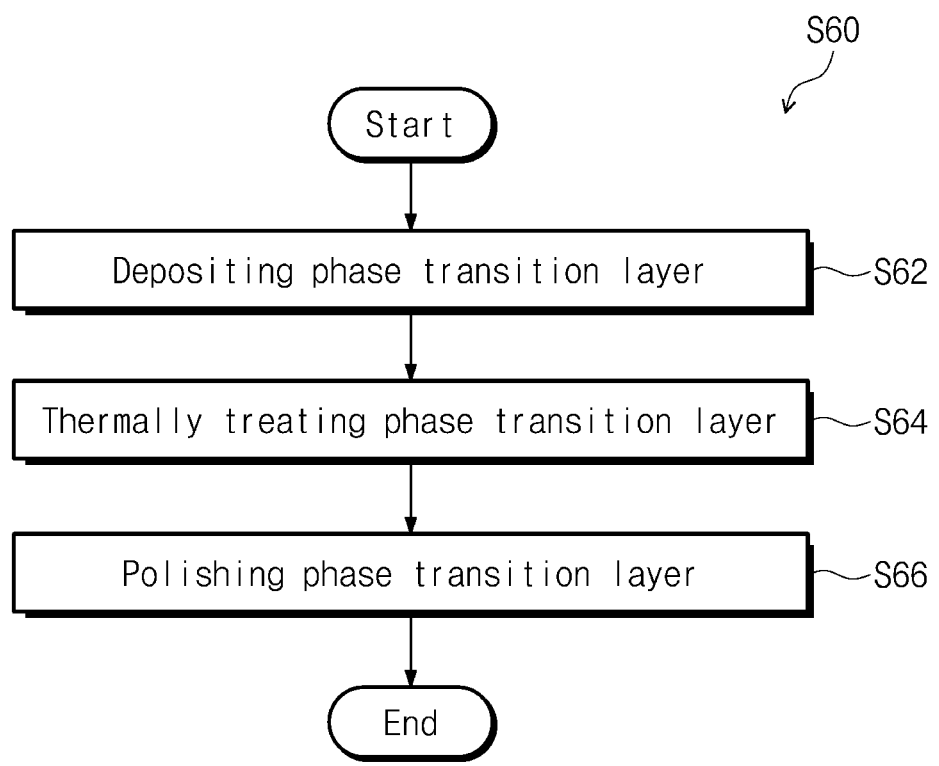
FIG. 12 is a flow chart illustrating a step of forming the phase transition layer of FIG. 1.

FIG. 12 illustrates an example of the step S60 of FIG. 1 (i.e., step of forming the phase transition layer 116).

Referring to FIG. 12, the forming of the phase transition layer 116 (in S60) may include depositing the phase transition layer 116 (in S62), thermally treating the phase transition layer 116 (in S64), and polishing the phase transition layer 116 (in S66).

Figure 13:
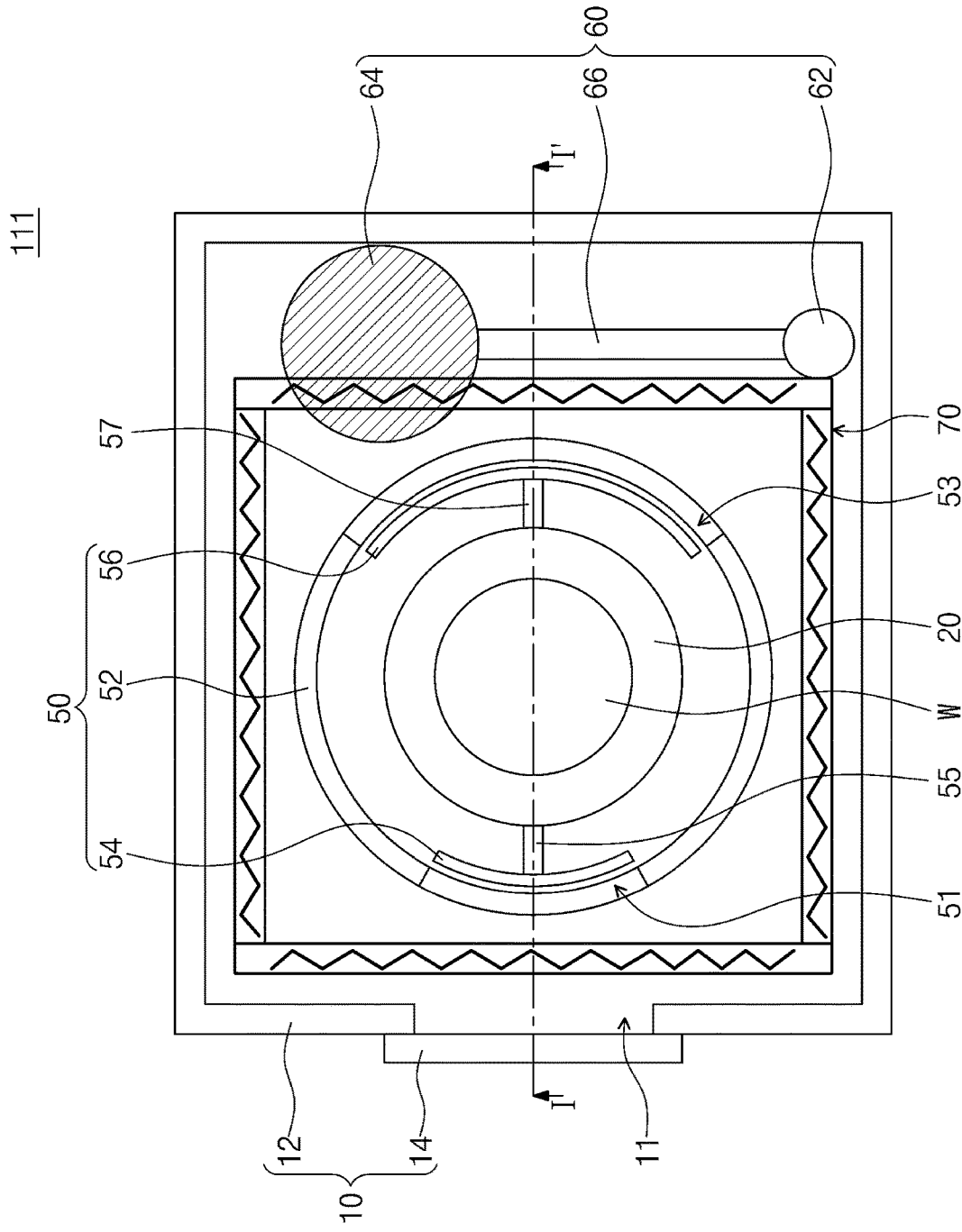
FIG. 13 is a plan view illustrating an example of an apparatus which is used to deposit the phase transition layer of FIG. 12.
Figure 14:
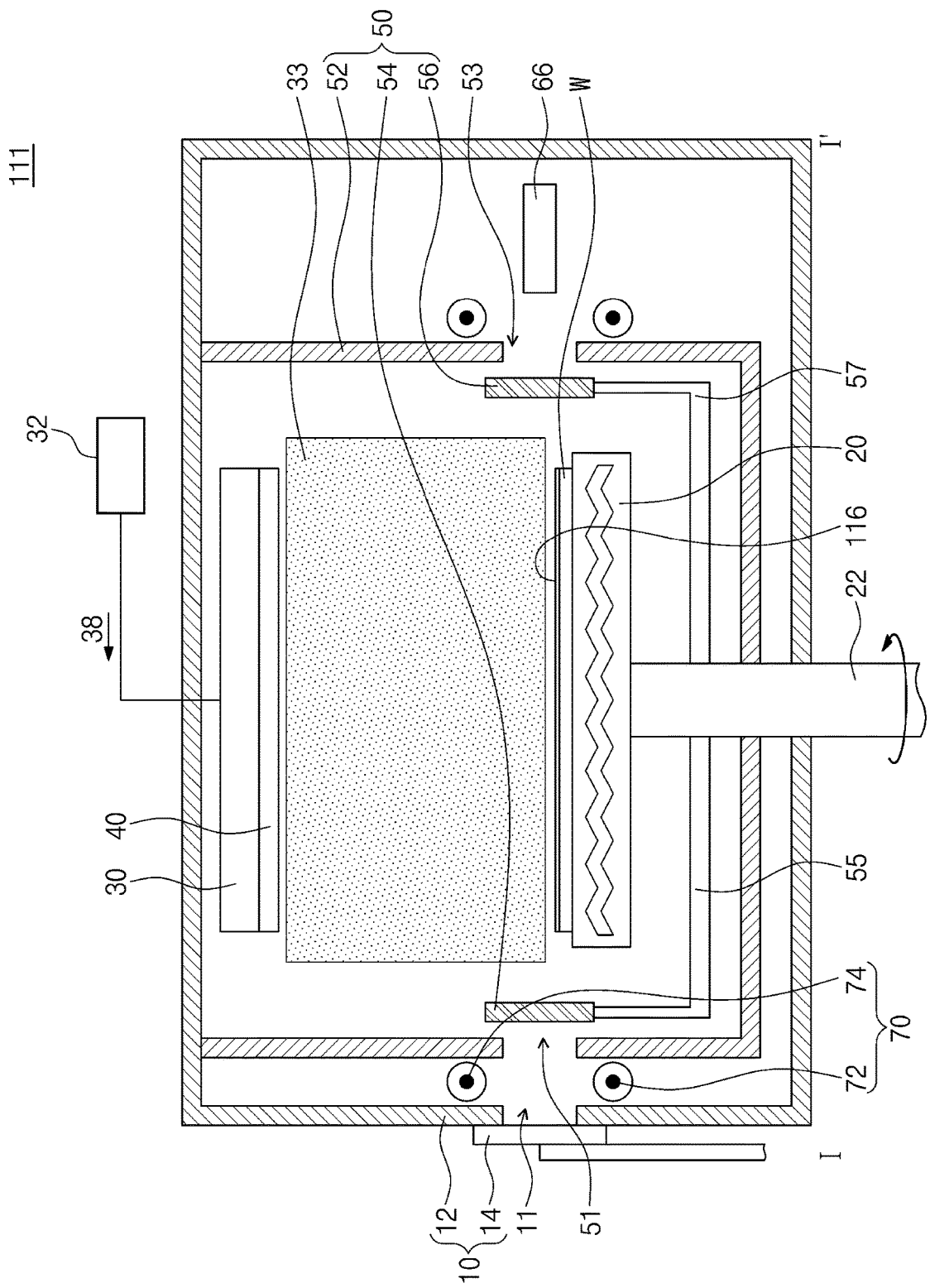
FIG. 14 is a sectional view taken along line I-I' of FIG. 13.

FIG. 13 illustrates an example of a system 111, which may be used for the step of FIG. 12 of forming the phase transition layer 116. FIG. 14 is a sectional view taken along line I-I' of FIG. 13.

Referring to FIG. 7 and FIGS. 12 to 15, the system 111 may be configured to deposit the phase transition layer 116 using plasma 33 (in S62). The phase transition layer 116 may be formed by a physical vapor deposition method such as a sputtering method. For example, the system 111 may include a physical vapor deposition system that is configured to execute a sputtering process. In some embodiments, the system 111 may include a chamber 10, a heater chuck 20, a plasma electrode 30, a target 40, a shield 50, a shutter 60, and an edge heating portion 70.

The chamber 10 may be configured to provide an inner space sealed from the outside, and the substrate W may be placed in the inner space of the chamber 10. In some embodiments, the chamber 10 may include a housing 12 and a slit valve 14. The substrate W may be provided in the housing 12. The slit valve 14 may be provided to open or close a valve opening 11 of the housing 12. The slit valve 14 may be opened, when the substrate W is loaded into the housing 12. The slit valve 14 may be closed, before depositing the phase transition layer 116 on the substrate W. When the slit valve 14 is closed, a gaseous substance (e.g., air and gas) may be pumped out from the housing 12. Thereafter, the phase transition layer 116 may be deposited on the substrate W. The slit valve 14 may again be opened, when the substrate W is unloaded from the housing 12.

The heater chuck 20 may be provided on a shaft 22 in the housing 12. The heater chuck 20 may be configured to load the substrate W. In addition, the heater chuck 20 may be used to heat the substrate W using heating power.

The plasma electrode 30 may be used to generate the plasma 33 in the housing 12 (in particular, between the target 40 and the substrate W) using an RF power 38. The RF power supplier 32 may supply the RF power 38 to the plasma electrode 30. The RF power 38 may range from about 1 KW to about 100 KW.

The target 40 may be provided on a bottom surface of the plasma electrode 30. The target 40 may contain a source material of the phase transition layer 116 to be deposited on the substrate W. For example, the target 40 may be prepared to contain a chalcogenide compound, in which composition ratio of Ge:Sb:Te is about 2:3:5, where Ge is Germanium, Sb is Antimony, and Te is Telluriam. In certain embodiments, the target 40 may be prepared to contain a chalcogenide compound, in which composition ratio of Ge:Sb:Te is about 2:2:5. The plasma 33 may be used to generate particles (hereinafter, a source material) (not shown), in which the source material for the phase transition layer 116 is contained. The source particle may be deposited on the substrate W to form the phase transition layer 116.

The shield 50 may be provided on an inner wall of the chamber 10 and between the target 40 and the heater chuck 20. In the case where the RF power 38 is applied to the plasma electrode 30, the plasma 33 may be generated in the shield 50. The shield 50 may be used to prevent heat loss from occurring when the plasma 33 is generated. In addition, the shield 50 may be used to prevent or suppress heat of the substrate W from being leaked. In some embodiments, the shield 50 may include a tube shield 52 and first and second sector shields 54 and 56. The tube shield 52 may be provided to surround the heater chuck 20 and the plasma electrode 30. The tube shield 52 may be configured to have first and second shield openings 51 and 53. The first shield opening 51 may be provided adjacent to the valve opening 11. The valve opening 11 and the first shield opening 51 may be used as a pathway for loading or unloading the substrate W. The second shield opening 53 may be provided to face the first shield opening 51. For example, the second shield opening 53 may be provided opposite to the first shield opening 51. The second shield opening 53 may be used as a pathway for loading or unloading the shutter 60. The first and second sector shields 54 and 56 may be configured to open or close the first and second shield openings 51 and 53. The first and second sector shields 54 and 56 may prevent or suppress heat loss from occurring at an edge region of the substrate W adjacent to the first and second shield openings 51 and 53. First and second shield arms 55 and 57 may be provided to connect the first and second sector shields 54 and 56 to the shaft 22. In the case where the shaft 22 is rotated, the first and second shield openings 51 and 53 may be opened or closed by the first and second sector shields 54 and 56, respectively.

If necessary, the shutter 60 may be provided on the substrate W and may be used to control a process of forming the phase transition layer 116 and/or depositing the source particle. In addition, the shutter 60 may be used to protect the substrate W from the plasma 33. The shutter 60 may include a shutter driver 62, a shutter plate 64, and a shutter arm 66. The shutter driver 62 may be placed outside the shield 50. The shutter plate 64 may have the same size and/or the same area as the substrate W, when viewed in a plan view. The shutter arm 66 may be used to connect the shutter plate 64 to the shutter driver 62. The shutter driver 62 may be configured to rotate the shutter arm 66, and the rotation of the shutter arm 66 may be used to place or remove the shutter plate 64 on or from the substrate W. For example, in the case where the shutter plate 64 is removed from the top surface of the substrate W, source particles in the plasma 33 may be deposited on the substrate W to form the phase transition layer 116. In the case where the shutter 60 is provided on the substrate W, the phase transition layer 116 may not be deposited on the substrate W.

The edge heating portion 70 may be configured to heat the shield 50, and in this case, radiation heat emitted from the shield 50 may be used to heat the edge region of the substrate W. That is, the edge heating portion 70 may be used to compensate heat loss, which occurs at the edge region of the substrate W, using the radiation heat from the shield 50.

Meanwhile, a deposition rate of the phase transition layer 116 may be increased in proportion to the RF power 38 and/or an intensity of the plasma 33. In the case where the RF power 38 is within a range from about 1 KW to about 100 KW, the phase transition layer 116 may have a deposition rate that allows a deposition thickness to be precisely controlled. For example, the phase transition layer 116 may have a deposition rate ranging from about 1 nm/min to about 100 nm/min. By contrast, in the case where the RF power 38 is within a range from about 1 MW to about 100 MW, the phase transition layer 116 may have a deposition rate that results in a difficulty in controlling a deposition thickness. For example, the phase transition layer 116 may have a deposition rate ranging from about 500 nm/min to about 1 μm/min.

In addition, the deposition rate of the phase transition layer 116 may be inversely proportional to the temperature of the substrate W. Here, the temperature of the substrate W may be a real temperature. If the temperature of the substrate W is lower than a specific temperature, the deposition rate of the phase transition layer 116 may be increased. For example, in the case where the RF power 38 is within a range from about 1 KW to about 100 KW and the temperature of the substrate W is less than about 200° C., the phase transition layer 116 may be formed at a controllable deposition rate. As an example, the phase transition layer 116 may be formed at a deposition rate of about 300 nm/min or higher, and in this case, at least a portion of the second contact hole 115 may not be filled with the phase transition layer 116.

In the case where the temperature of the substrate W is sufficiently high, the phase transition layer 116 may be deposited at a controllable deposition rate of 100 nm/min or lower. The phase transition layer 116 may be formed to fill the second contact hole 115. In some embodiments, the phase transition layer 116 may be formed by heating the substrate W to a temperature, which is 40%-50% of a melting point of the phase transition layer 116, using the heater chuck 20 and the edge heating portion 70. In the case where the target 40 or the phase transition layer 116 contains a chalcogenide compound, in which composition ratio of Ge:Sb:Te is about 2:3:5, the phase transition layer 116 may have a melting point of about 620° C. In the case where the melting point of the phase transition layer 116 is about 620° C., the substrate W may be heated up to about 248° C.-310° C. In this example, forming of the phase transition layer 116 may be described as being performed at a temperature in the range of about 248° C.-310° C. In the case where the target 40 or the phase transition layer 116 contains a chalcogenide compound, in which composition ratio of Ge:Sb:Te is about 2:2:5, the phase transition layer 116 may have a melting point of about 600° C. When the melting point of the phase transition layer 116 is about 600° C., the substrate W may be heated up to about 240° C.-300° C. In this example, forming of the phase transition layer 116 may be described as being performed at a temperature in the range of about 240° C.-300° C.

In some embodiments, in the case where the substrate W is heated to a temperature that is 40%-50% of the melting point of the phase transition layer 116, the phase transition layer 116 may be formed to have a void 117 in the second contact hole 115. The void 117 may serve as a defect source of the phase transition layer 116. The void 117 may have a height, which is less than a depth of the second contact hole 115, and may have a width, which is less than a width of the second contact hole 115.

In the case where the heating temperature of the substrate W is lower than 40% of the melting point of the phase transition layer 116, the phase transition layer 116 may be formed at an excessively high deposition rate, and thus, at least a portion of the second contact hole 115 may not be filled with the phase transition layer 116. This is because the source particles in the plasma 33 are adsorbed on the substrate W at an excessively fast speed.

In the case where the heating temperature of the substrate W is higher than 50% of the melting point of the phase transition layer 116, little of the source particles for the phase transition layer 116 may be deposited on the substrate W, owing to the high temperature of the substrate W, and the majority of the source particles may be pumped out to the outside of the chamber 10. For example, in the case where the heating temperature of the substrate W is higher than about 360° C., the phase transition layer 116 may be formed at a deposition rate of several angstroms per minute. Furthermore, in the case where the phase transition layer 116 is formed at temperature of about 360° C. or higher, the phase transition layer 116 may not contain a metallic element in chalcogenide compound.

Figure 8:
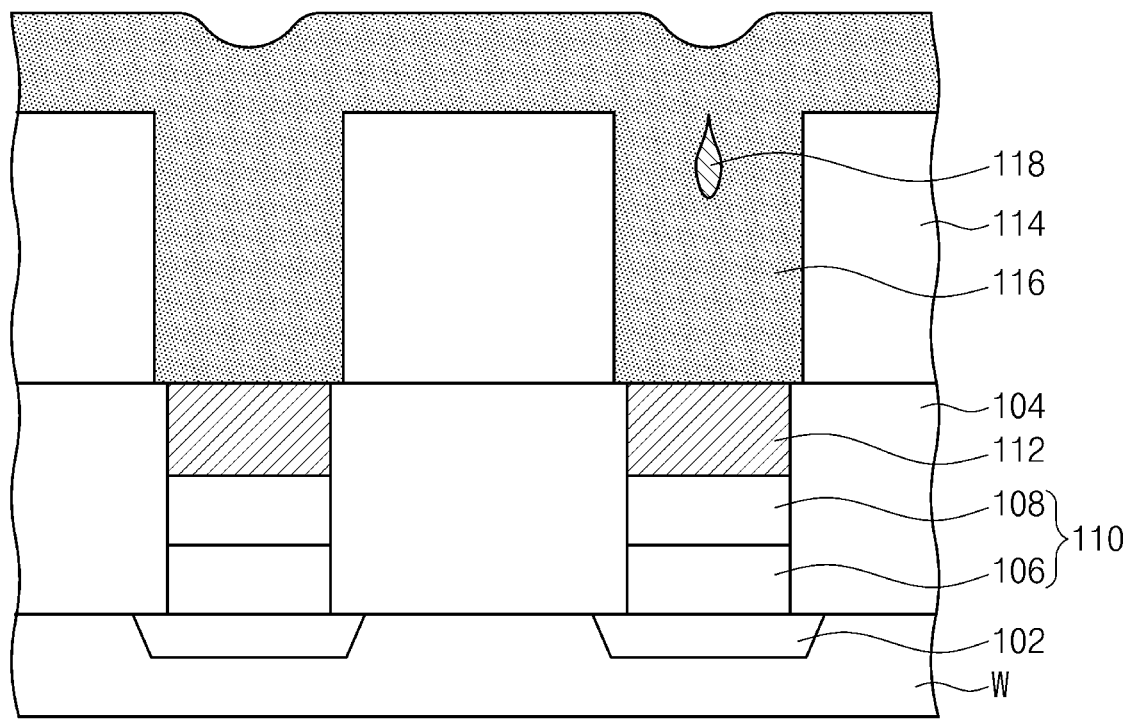
Figure 15:
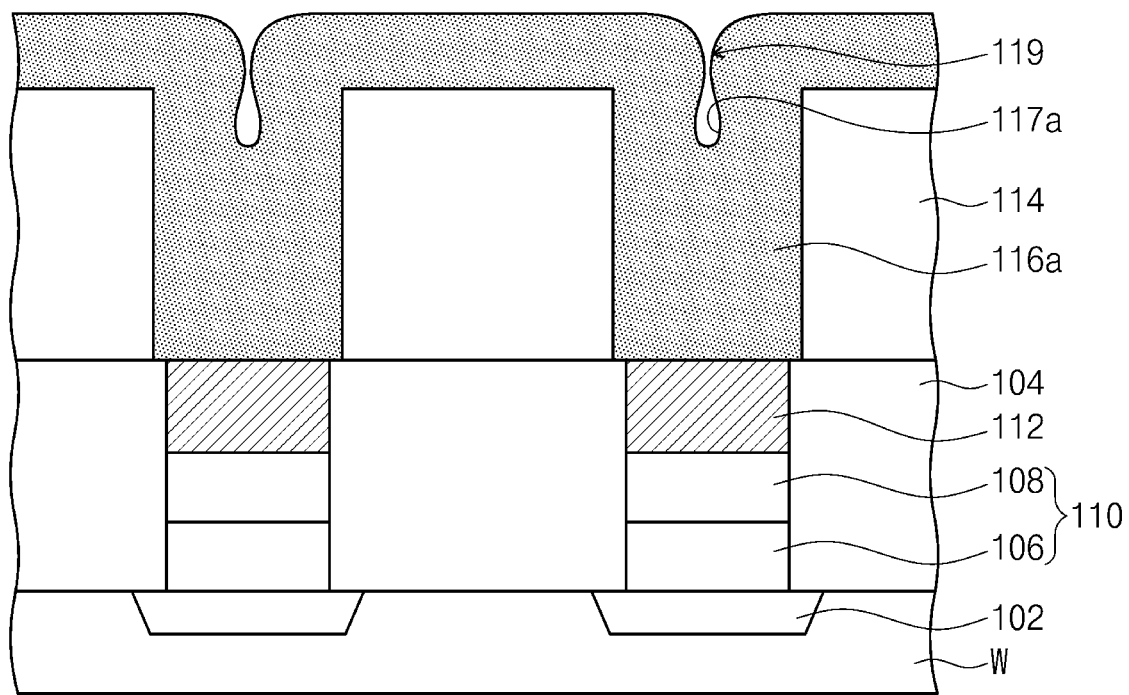
FIGS. 15 to 18 are sectional views illustrating a step of forming the phase transition layer of FIG. 1.

Referring to FIGS. 8, 13, and 15, the heater chuck 20 and the edge heating portion 70 may be used to thermally treat the phase transition layer 116 and thereby to form a diffusion layer 118 in the void 117 (in S64). The plasma 33 may be removed from an internal space of the shield 50, or the shutter 60 may be provided on the substrate W. The substrate W may be heated to a temperature that is higher than or equal to a deposition temperature (e.g., about 50% of the melting point) of the phase transition layer 116. In some embodiments, the substrate W may be heated to a temperature that is lower than about 55% of the melting point of the phase transition layer 116. In the case where the phase transition layer 116 has a melting point of about 620° C., the substrate W may be heated to about 310° C.-340° C. In the case where the phase transition layer 116 has a melting point of about 600° C., the substrate W may be heated to about 300° C.-330° C.

In the case where the substrate W is heated to a temperature ranging from about 50% to about 55% of the melting point of the phase transition layer 116, the diffusion layer 118 may be formed in the void 117. The diffusion layer 118 may be formed to fill the void 117, and in this case, the void 117 may be removed from the phase transition layer 116. The diffusion layer 118 may contain the same metallic element (e.g., Sb and Te) as that of the phase transition layer 116.

Experimental Example

When the substrate W was thermally treated at temperature of 340° C., a composition ratio of Ge:Sb:Te in the phase transition layer 116 was about 18:37:45 on a top surface of the second mold layer 114 and was about 6:38:56 in the second contact hole 115, where the second contact hole 115 was formed to have an aspect ratio of about 3.2:1. A composition ratio of a metallic element (e.g., Sb or Te) to a nonmetallic element (e.g., Ge) of the phase transition layer 116 was higher (e.g., by about three times) in the second contact hole 115 than on the top surface of the second mold layer 114. This means that the metallic element (e.g., Sb and Te), which is contained in a portion of the phase transition layer 116 located on the second mold layer 114, may be diffused into the second contact hole 115, and the diffusion layer 118 may be formed as a result of such diffusion.

Experimental Example

When the substrate W was thermally treated at temperature of 340° C., a composition ratio of Ge:Sb:Te in the phase transition layer 116 was about 18:37:45 on the second mold layer 114 between the second contact holes 115 and was about 11:34:55 in the second contact hole 115, where the second contact holes 115 were formed to have an aspect ratio of about 3.7:1. A composition ratio of a metallic element (e.g., Sb or Te) to a nonmetallic element (e.g., Ge) of the phase transition layer 116 was higher (e.g., by about two times) in the second contact hole 115 than on the top surface of the second mold layer 114. Similarly, this means that the metallic element (e.g., Sb and Te), which is contained in a portion of the phase transition layer 116 located on the second mold layer 114, may be diffused into the second contact hole 115, and the diffusion layer 118 may be formed as a result of such diffusion.

In the case where the substrate W is heated to a temperature higher than about 55% of the melting point of the phase transition layer 116, the phase transition layer 116 may be burned, and the properties of the phase transition layer 116 may be damaged or diminished. For example, in the case where the substrate W is heated to a temperature of about 360° C. or higher, the metallic element (e.g., Sb and Te) in the phase transition layer 116 may be sublimated, and in this case, the phase transition property of the phase transition layer 116 may disappear completely or partly.

Figure 9:
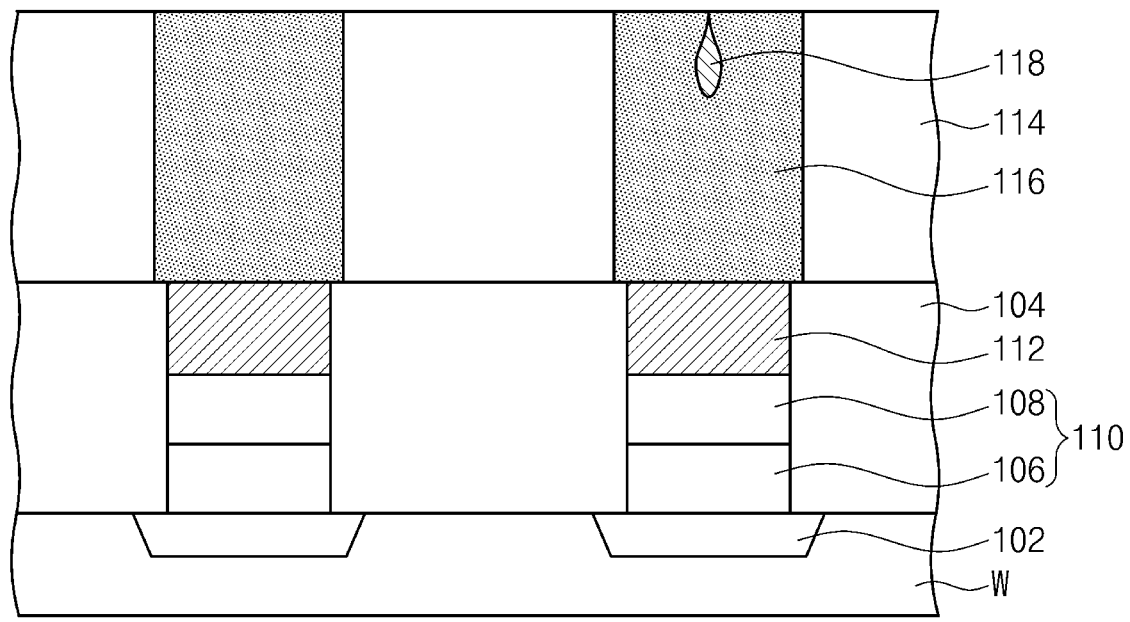

Referring to FIGS. 9 and 12, the phase transition layer 116 may be polished (in S66). A chemical mechanical polishing (CMP) method may be used to polish the phase transition layer 116. The polishing of the phase transition layer 116 may be performed to expose a top surface of the second mold layer 114. The phase transition layer 116 may be formed in the second contact hole 115. For example, the phase transition layer 116, which was formed in the second contact hole 115 and on a top surface of the second mold layer 114, may be removed from above the second mold layer 114 so that it remains only in the second contact hole 115.

Figure 10:
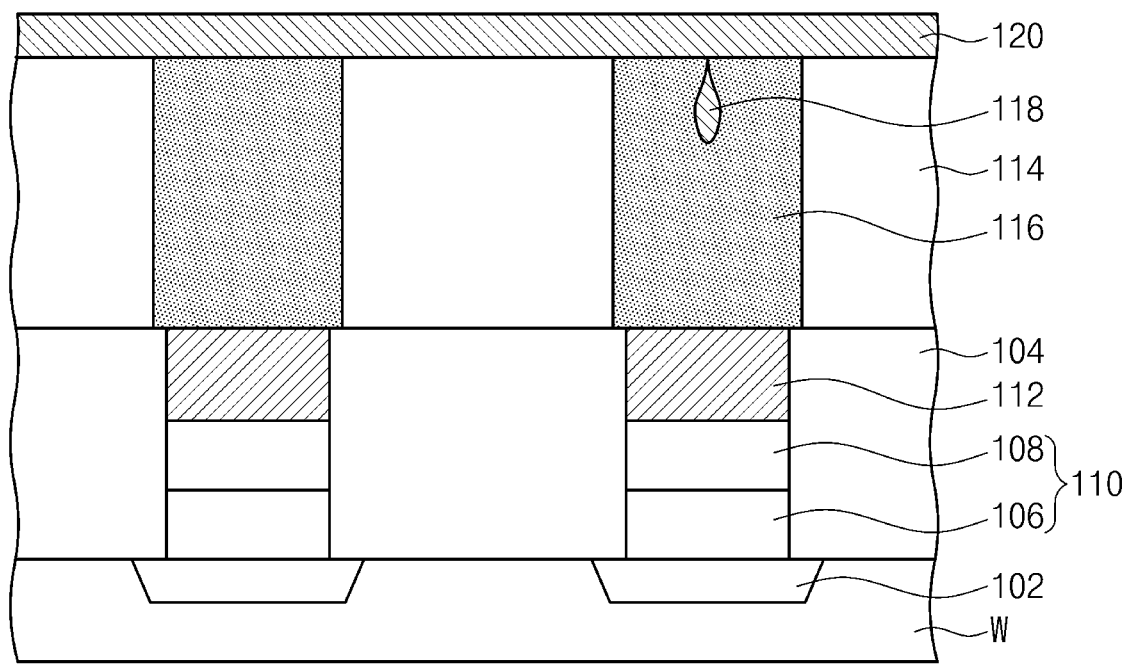

Referring to FIGS. 1 and 10, an upper electrode 120 may be formed on the phase transition layer 116 and the second mold layer 114 (in S60). The formation of the upper electrode 120 may include depositing a metal layer (e.g., of Al, Mo, Co, or W) using a deposition process (e.g., PVD or CVD) and then performing a photolithography and etching process on the metal layer. In some embodiments, the upper electrode 120 may have a substantially uniform thickness above a top surface of the phase transition layer 116 and a top surface of the second mold layer 114.

Figure 11:
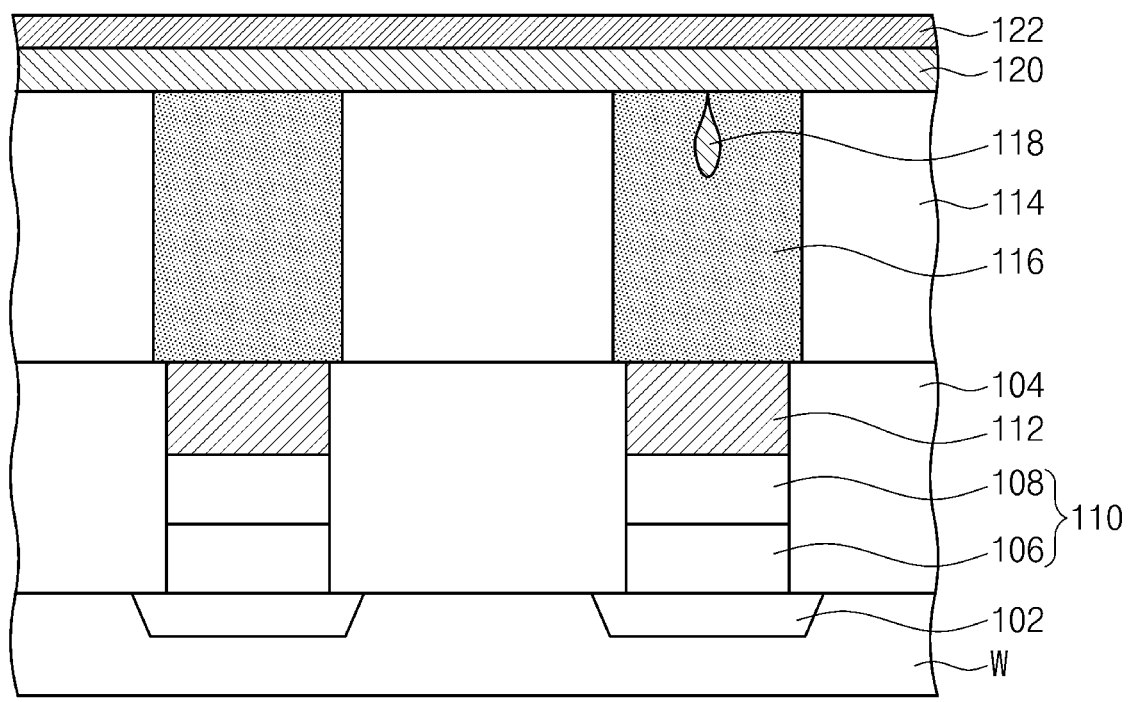

Referring to FIGS. 1 and 11, a bit line 122 may be formed on the upper electrode 120 (in S70). The formation of the bit line 122 may include depositing a metal layer (e.g., of Al, Mo, Co, or W) using a deposition process (e.g., PVD or CVD) and then performing a photolithography and etching process on the metal layer. In some embodiments, the bit line 122 may have a substantially uniform thickness above a top surface of the upper electrode 120. The bit line 122 may extend in a second direction, which is different from an extension direction of the word line 102 or from the first direction. In some embodiments, the second direction is perpendicular to the first direction. If a phase transition voltage (e.g., an erase voltage or a writing voltage) is applied between the word line 102 and the bit line 122, a phase of the phase transition layer 116 may be changed. For example, the phase of the phase transition layer 116 may be changed from amorphous to polycrystalline or from polycrystalline to amorphous. Due to the change in phase of the phase transition layer 116, the diffusion layer 118 may be absorbed into the phase transition layer 116, and in this case, the diffusion layer 118 may disappear.

FIGS. 15 to 18 are sectional views illustrating an example of the step S60 of FIG. 1 (i.e., step of forming the phase transition layer 116).

Referring to FIG. 1 and FIGS. 15 to 17, the forming of the phase transition layer 116 (in S60) may include depositing a portion of the phase transition layer 116 and thermally treating the substrate W. In some embodiments, the forming of the phase transition layer 116 (in S60) may include a plurality of process cycles, which are sequentially and repeatedly performed, and each of which includes steps of partially depositing the phase transition layer 116 and of thermally treating the substrate W.

Referring to FIGS. 13 to 15, if the plasma 33 is generated using the plasma electrode 30, a lower phase transition layer 116a may be deposited on the second mold layer 114 and the lower electrode 112. For example, the lower phase transition layer 116a may be formed of or may include at least one of chalcogenide compounds (e.g., including Ge, Sb, and Te). When the plasma 33 is generated on the substrate W by the plasma electrode 30, the heater chuck 20 and the edge heating portion 70 may be used to heat the substrate W to a temperature that is 40%-50% of the temperature of the plasma electrode 30. The lower phase transition layer 116a may be formed to have an overhang 119 and a trench (or a void) located below the overhang 119. The overhang 19 may result when the trench 117a is formed to have a width that is smaller at its entrance region than at its center region. In the case where the overhang 119 is formed, the void 117 of FIG. 7 may be easily formed in the phase transition layer 116.

Figure 16:
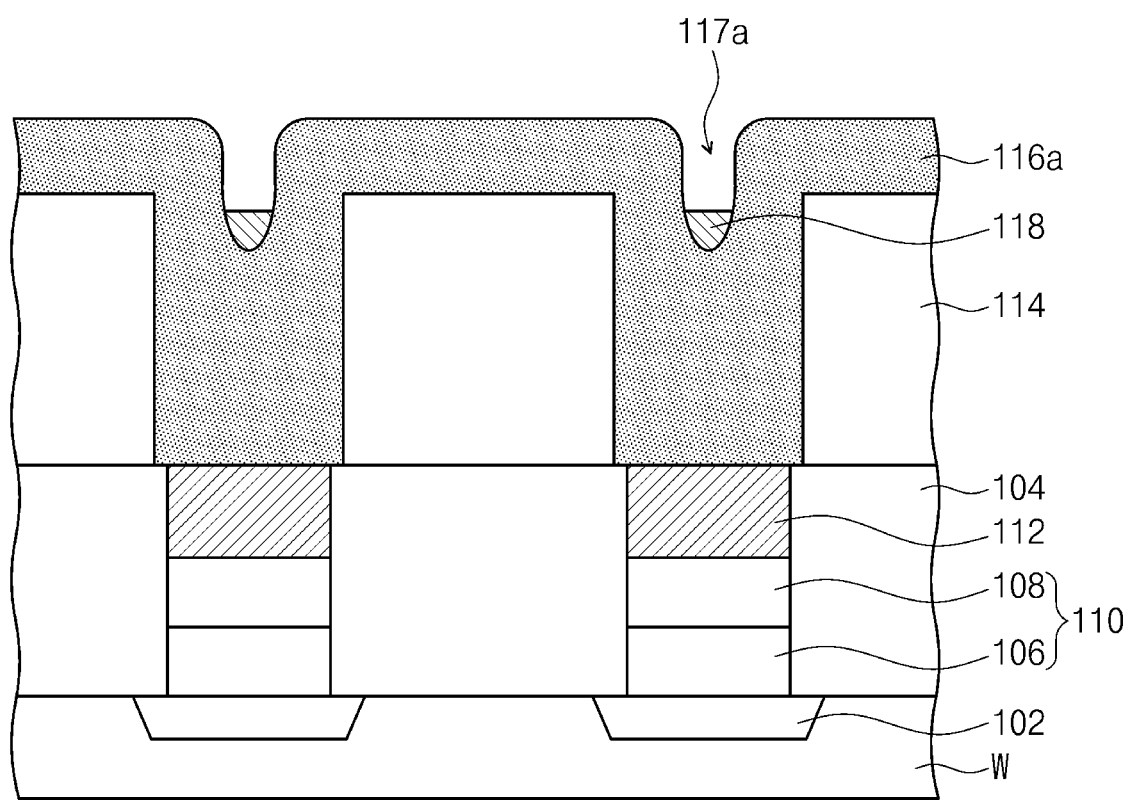
Figure 17:
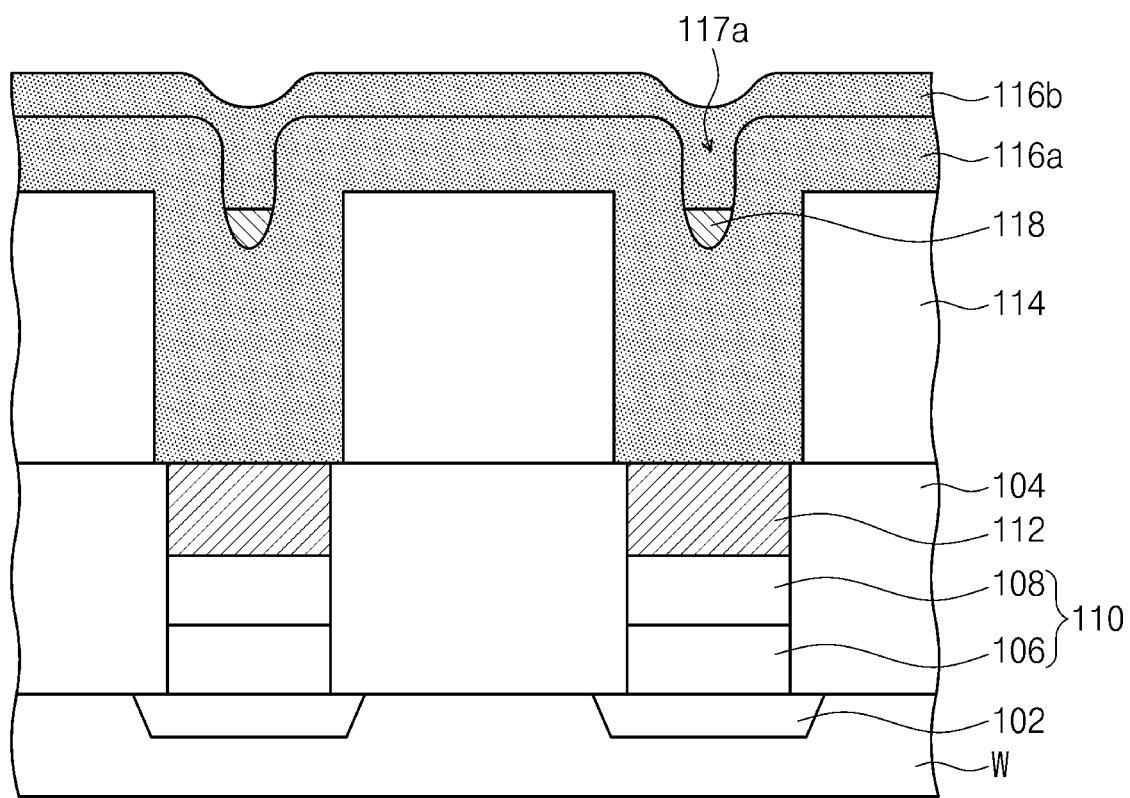

Referring to FIGS. 13, 14, and 16, a thermal treatment process may be performed on the substrate W to remove the overhang 119 of the lower phase transition layer 116a. If the plasma 33 is removed, the substrate W may be heated to a temperature, which is 50%-55% of the melting point of the lower phase transition layer 116a, by the heater chuck 20 and the edge heating portion 70. In the case where the substrate W is heated to the temperature that is 50%-55% of the melting point of the lower phase transition layer 116a, the diffusion layer 118 may be formed in the trench 117a. The diffusion layer 118 may contain a metallic element (e.g., Sb and Te) of a chalcogenide compound diffused from a portion of the phase transition layer 116 located on the top surface of the second mold layer 114. A surface area of the phase transition layer 116 on the second mold layer 114 may be reduced, and as a result, the overhang 119 may be removed. In certain embodiments, the overhang 119 may have a reduced volume or may disappear. In certain embodiments, the diffusion layer 118 may contain a metallic element (e.g., Sb and Te) of a chalcogenide compound that is moved down along a side surface of the trench 117a to form the diffusion layer 118. The width of the entrance region of the trench 117a may become larger than the width of the center region of the trench 117a.

Referring to FIGS. 1 to 14 and FIG. 17, the plasma electrode 30 may be used to generate the plasma 33, and in this case, an upper phase transition layer 116b may be formed on the lower phase transition layer 116a and the diffusion layer 118. The upper phase transition layer 116b may be formed of or may include at least one of chalcogenide compounds (e.g., including Ge, Sb, and Te). When the plasma 33 is generated on the substrate W, the heater chuck 20 and the edge heating portion 70 may be used to heat the substrate W to a temperature that is 40%-50% of a melting point of the upper phase transition layer 116b. The upper phase transition layer 116b may be formed to fill at least a portion of the trench 117a. The increased width of the entrance region of the trench 117a relative to the width of the center region of the trench 117a may improve the ability of the upper phase transition layer 116b to fill at least a portion of the trench 117a.

Figure 18:
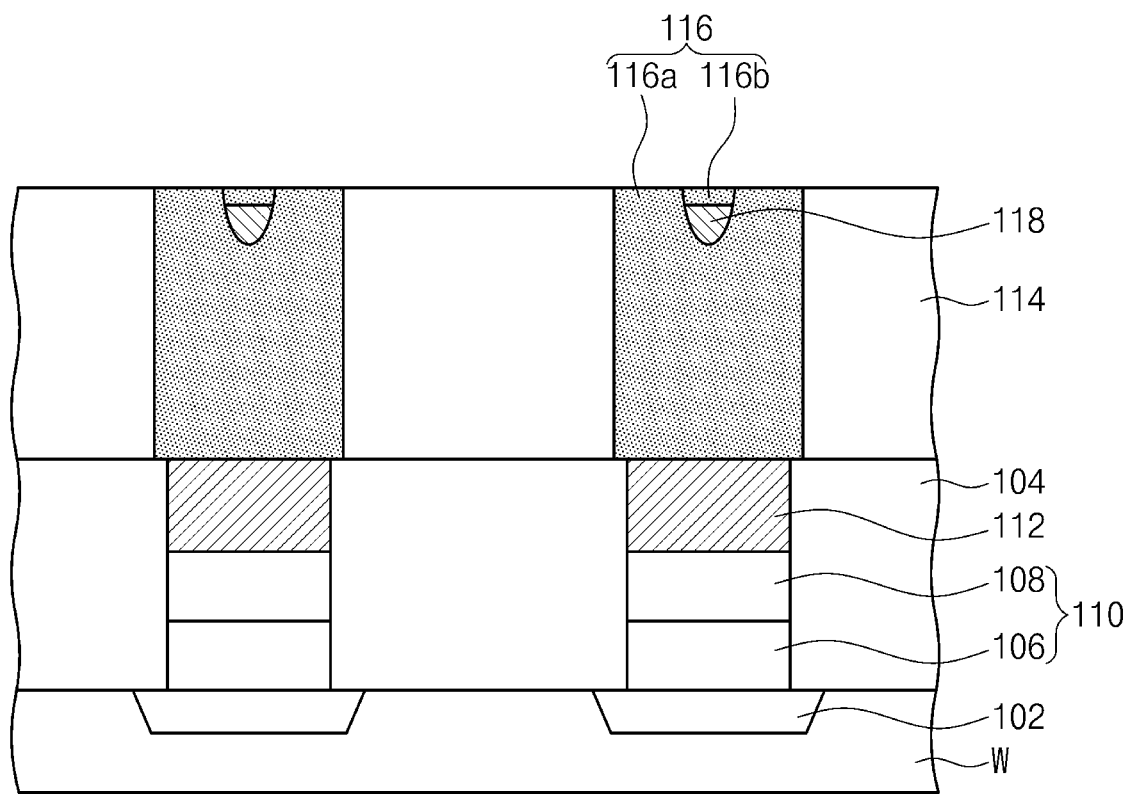

Referring to FIG. 18, the lower phase transition layer 116a and the upper phase transition layer 116b may be polished to form the phase transition layer 116. The diffusion layer 118 may be formed in the phase transition layer 116. Thereafter, the upper electrode 120 and the bit line 122 may be sequentially formed on the phase transition layer 116 and the second mold layer 114.

In a method of fabricating a semiconductor device according to some embodiments, a thermal treatment step may be performed to heat a substrate to a temperature that is lower than or equal to about 55% of a melting point of a phase transition layer, and this may make it possible to remove a void from the phase transition layer.

While example embodiments have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming a mold layer on a substrate, the mold layer having a hole exposing a portion of the substrate;
    forming a phase transition layer in the hole, the phase transition layer having at least one of a void and an overhang; and
    thermally treating the phase transition layer to remove the at least one of the void and the overhang from the phase transition layer,
    wherein thermally treating the phase transition layer comprises heating the substrate to a first temperature to form a diffusion layer in the phase transition layer, and
    wherein the first temperature is lower than or equal to 55% of a melting point of the phase transition layer.

2. The method of claim 1, wherein the phase transition layer is formed by a physical vapor deposition method or a sputtering method using a chalcogenide compound as a target material.

3. The method of claim 1,
    wherein the phase transition layer contains a chalcogenide compound in which a composition ratio of Ge:Sb:Te is about 2:3:5, and
    wherein the void is filled with a material including Sb and Te elements of the chalcogenide compound.

4. The method of claim 1, wherein the phase transition layer comprises:
a lower phase transition layer; and
an upper phase transition layer formed on the lower phase transition layer,
wherein the diffusion layer is formed in the hole and between the lower and upper phase transition layers.

5. The method of claim 1, further comprising polishing the phase transition layer.

6. The method of claim 1, wherein the phase transition layer is formed at a temperature that is 40%-50% of the melting point of the phase transition layer.

7. The method of claim 6,
wherein the melting point of the phase transition layer is about 620° C., and
wherein the forming the phase transition layer is performed at a temperature in the range of 248° C.-310° C.

8. The method of claim 7, wherein the first temperature is equal to or higher than about 50% of the melting point of the phase transition layer and ranges from about 310° C. to 340° C.

9. The method of claim 6,
wherein the melting point of the phase transition layer is about 600° C., and
wherein the forming the phase transition layer is performed at a temperature in the range of 240° C.-300° C.

10. The method of claim 9, wherein the first temperature is equal to or higher than 50% of the melting point of the phase transition layer and ranges from 300° C. to 330° C.

11. A method of fabricating a semiconductor device, comprising:
forming a mold layer on a substrate, the mold layer having a hole exposing a portion of the substrate;
forming a phase transition layer in the hole at a first temperature higher than room temperature, the phase transition layer having a void; and
thermally treating the phase transition layer at a second temperature to remove the void, the second temperature being higher than the first temperature,
wherein the second temperature is lower than or equal to 55% of a melting point of the phase transition layer.

12. The method of claim 11, wherein the melting point of the phase transition layer is about 620° C., and
wherein the second temperature is lower than or equal to 340° C.

13. The method of claim 12, wherein the melting point of the phase transition layer is about 600° C., and
wherein the second temperature is lower than or equal to 330° C.

14. The method of claim 11, wherein the first temperature is 40%-50% of the melting point of the phase transition layer.

15. The method of claim 14, wherein the second temperature is higher than or equal to 50% of the melting point of the phase transition layer.

16. A method of fabricating a semiconductor device, comprising:
forming a mold layer on a substrate, the mold layer having a hole exposing a portion of the substrate;
forming a phase transition layer in the hole at a first temperature, the phase transition layer having a void; and
thermally treating the phase transition layer at a second temperature to remove the void from the phase transition layer,
wherein forming the phase transition layer in the hole comprises heating the substrate to the first temperature,
wherein thermally treating the phase transition layer comprises heating the substrate to the second temperature to form a diffusion layer in the phase transition layer, and
wherein the first temperature is in a range of 40%-50% of a melting point of the phase transition layer and the second temperature is lower than or equal to 55% of a melting point of the phase transition layer.

17. The method of claim 16,
wherein the melting point of the phase transition layer is about 620° C.,
wherein the first temperature is in a range of 248° C. to 310° C., and
wherein the second temperature is in a range of 310° C. to 340° C.

18. The method of claim 16,
wherein the melting point of the phase transition layer is about 600° C.,
wherein the first temperature is in a range of 240° C. to 300° C., and
wherein the second temperature is in a range of 300° C. to 330° C.

19. The method of claim 16,
wherein the phase transition layer contains a chalcogenide compound in which a composition ratio of Ge:Sb:Te is about 2:3:5, and
wherein the void is filled with a material including Sb and Te elements of the chalcogenide compound.

20. The method of claim 16, wherein the phase transition layer comprises:
a lower phase transition layer; and
an upper phase transition layer formed on the lower phase transition layer,
wherein the diffusion layer is formed in the hole and between the lower and upper phase transition layers.

* * * * *